(12) United States Patent
Wu et al.

(10) Patent No.: US 6,858,874 B2
(45) Date of Patent: Feb. 22, 2005

(54) PACKAGE STRUCTURE OF ORGANIC ELECTROLUMINESCENCE PANEL

(75) Inventors: Chin-Long Wu, Tainan (TW);
Tung-Yang Tang, Hsinchu (TW);
Shih-Ming Hsu, Hsinchu (TW);
Shang-Wei Chen, Hsinchu (TW);
Tein-Wang Huang, Hsinchu (TW)

(73) Assignee: RiTdisplay Corporation, Hsinchu (TW)

( * ) Notice: Subject to any disclaimer, the term of this patent is extended or adjusted under 35 U.S.C. 154(b) by 91 days.

(21) Appl. No.: 10/250,184

(22) Filed: Jun. 11, 2003

(65) Prior Publication Data
US 2004/0251045 A1 Dec. 16, 2004

(30) Foreign Application Priority Data
Feb. 8, 2002 (TW) .................................... 91201632 U (51) Int. Cl.⁷ .............................................. H01L 27/15
(52) U.S. Cl. .............................. 257/82; 257/81; 257/72; 257/88; 257/99

(58) Field of Search ............................. 257/81–82, 72, 257/88, 99, 431–434

(56) References Cited

U.S. PATENT DOCUMENTS

| | | | |
|---|---|---|---|
| 5,693,170 A | 12/1997 | Li | 156/299 |
| 5,747,363 A | 5/1998 | Wei et al. | 438/5 |
| 6,677,620 B2 * | 1/2004 | Ishii et al. | 257/100 |

* cited by examiner

Primary Examiner—Luan Thai
(74) Attorney, Agent, or Firm—Jiang Chyun IP Office (57) ABSTRACT

A package structure of an OEL panel includes a printed circuit board, at least one OEL panel, and several bumps. Wherein, the OEL panel has several poly solder interconnections arranged in an array structure. The printed circuit board has several solder pads, which are also implemented with bumps. The at least one OEL panel is disposed on the printed circuit board to have the electric connection with the printed circuit board through the poly solder interconnections and the bumps.

29 Claims, 14 Drawing Sheets

PACKAGE STRUCTURE OF ORGANIC ELECTROLUMINESCENCE PANEL

CROSS REFERENCE TO RELATED APPLICATIONS

This application claims the priority benefit of Taiwan application serial no.91201632, filed on Feb. 8, 2002.

BACKGROUND OF INVENTION

1. Field of Invention

The present invention relates to a package structure of an organic electroluminescence (OEL) panel. More particularly, the present invention relates to a package structure of an OEL panel, having the poly solder interconnection arranged in an array structure.

2. Description of Related Art

The OEL device is a device that uses the organic functional materials with the property of spontaneous light-emitting to achieve the displaying effect. According to the different molecular weight of the organic functional materials, it can be categorized into a small molecular organic light emitting device (SM-OLED) and the polymer light-emitting device (PLED).

The OEL device is using two electrodes to hold an organic functional material film from both sides. When a proper bias is applied on it, the holes will be injected from the anode to the organic functional material film and the electrons will be injected from the cathode to the organic functional material film. Due to this externally applied electric field, a voltage difference is produced. This causes carriers to be moved in the organic functional material film and cause a recombination of electrons and holes, wherein a portion of electron-holes recombine and release energy, which excites the molecules to an excited state as the excited molecules. The excited molecules will release the excited energy, when excited molecules return back to the ground state. A certain portion of the released energy is released via the photons, resulting in emitting light. This is the basic mechanism for the OEL device to emit the light. Since the kind of organic electroluminescence device has the ability to spontaneously emit light, it has many advantages of large viewing angle, fast response time, low driving voltage, full color, and so on, and therefore is expected to be the technology on the flat display device for the new generation. Currently, the OEL device has been developed to the stage in practical application. Also and, it can be expected about the application on the color flat display device for the next generation, such as the displaying panel for any size, the outdoor huge panel, computer, and TV screen. However, comparing with the other display technology, the development for OEL device is a little late, the technology has not been completely developed yet. Thus, it is still has many aspects needing further development during the stage to commercialize the OEL display device.

Figure 1:
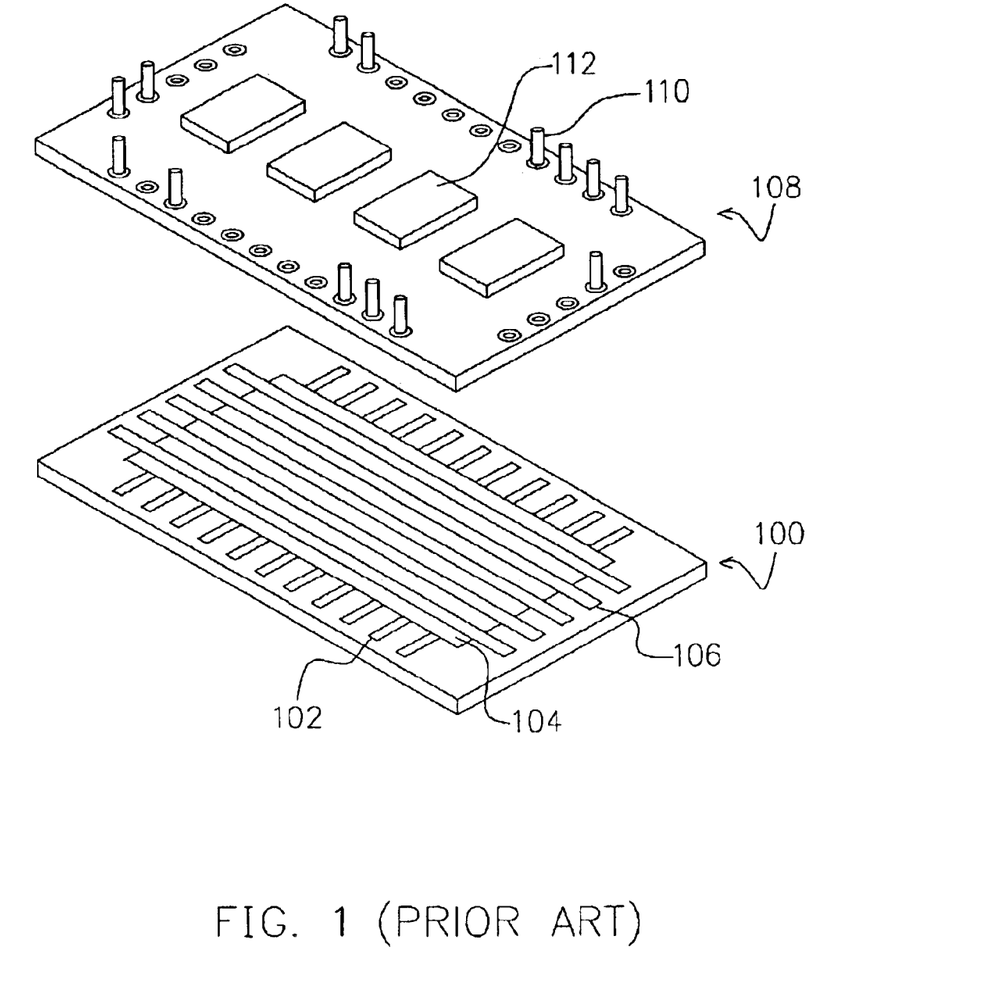
FIG. 1 is a drawing, schematically illustrating a package structure for the conventional OEL panel.

Referring to FIG. 1, FIG. 1 is a drawing, schematically illustrating a packaging structure for the conventional organic electroluminescence panel. The U.S. Pat. No. 5,747, 363 has disclosed a package for an OEL panel, in which the OEL panel mainly includes an OEL panel 100 and a substrate 108. Wherein, the OEL panel 100 has a number of stripe-like anodes 102, an organic light emitting layer 104, and a number of stripe-like cathodes 106. The substrate 108 is implemented with a driving chip 112 and connection pins 110. The pins 110 on the substrate 108 are electrically coupled to the anodes 102 and the cathodes 106 on the OEL panel 100 through the conductive paste.

Even though the packaging structure for the foregoing OEL panel can effectively integrate the driving chip onto the same substrate, it still encounters a restriction of size when a larger size is eventually desired.

Figure 2:
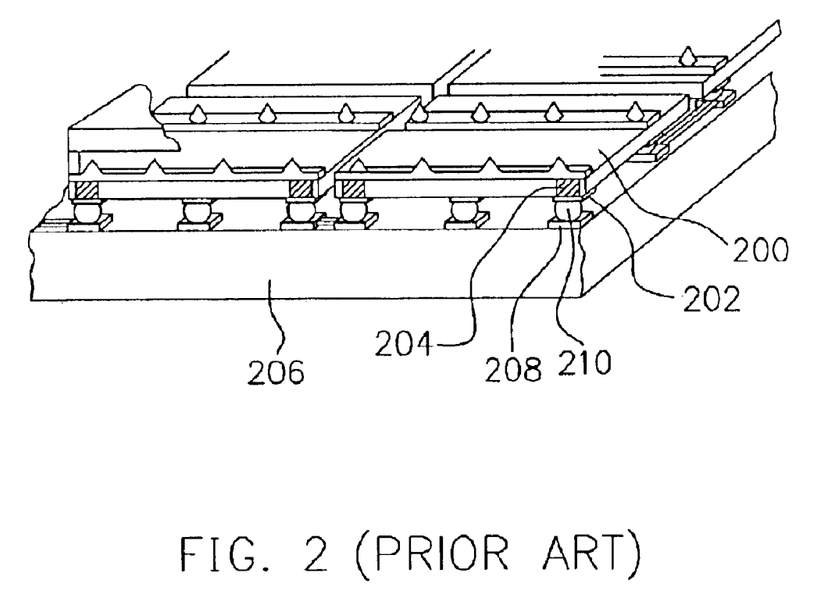
FIG. 2 is a drawing, schematically illustrating another package structure for the conventional OEL panel.

Referring to FIG. 2, FIG. 2 is a drawing, schematically illustrating a packaging structure for another conventional organic electroluminescence panel. The U.S. Pat. No. 5,693, 170 illustrates another packaging structure for an OEL panel, which includes a several display blocks 200, and a common-use substrate 206 with several bumps or tin balls 210. Wherein, the display blocks 200 have several contact pads 202 near to the surface of the common-use substrate 206. The contact pads 202 are used for the electric connection with the electrodes of anode and cathode on the display blocks 200 via, for example, the plugs 204. The common-use substrate 206 is implemented with several contact pads 208 with respect to the contact pads 202. The bumps 210 are implemented between the contact pads 202 and the contact pads 208, so as to have electric connection.

Even though the foregoing packaging structure for the OEL panel can use several display blocks for assembly, so as to achieve the objective of huge size, during soldering the contact pads and the bumps, the necessary high temperature in the solder reflowing process would often cause the common-use substrate to be warped. Moreover, the high temperature solder reflowing process would also cause improper affection on the organic light emitting layer in the OEL panel.

SUMMARY OF INVENTION

An objective of the present invention is to provide a packaging structure for the OEL panel with less issue on low stress force and better conductivity.

Another objective of the present invention is to provide a packaging structure for the OEL panel, in which multiple OEL panels can be assembled to the same printed circuit board, so as to breakthrough the restriction of size for the huge size.

In accordance with the foregoing and other objectives of the present invention, the invention provides a package structure of the OEL panel, including a printed circuit board, one or multiple OEL panels, multiple bumps, and underfill. Wherein, the printed circuit board has multiple solder pads, and at least one OEL panel is implemented on the printed circuit board. The bumps are respectively disposed between the solder pads on the printed circuit board and the poly solder interconnections, so as to have the electric connection for the OEL panel and the printed circuit board. In addition, the underfill is disposed between the printed circuit board and the panel. The underfill includes, for example, the hydrophobic material, having the ability of preventing the water from diffusing in and the stress buffer at the same time.

In the invention, the OEL panel includes a substrate, a first anode, at least one patterned organic light emitting layer, a second electrode, a protection layer, and a poly solder interconnection arranged in an array structure. Wherein, the first electrode is disposed on the substrate. The first electrode includes a driving region and at least one contact region, in which the contact region is protruding out from the driving region. The patterned organic light emitting layer is disposed on the substrate and exposes the contact region. The second electrode is disposed on the organic light emitting layer but not covering the contact region as a design principle. The protection layer is disposed over the substrate, in which the protection layer has multiple openings arranged in an array, so as to expose the driving region and a portion of the second electrode. The poly solder interconnection is disposed on the exposed contact region and the second electrode. Since the opening is arranged into an array, the poly solder interconnection is also formed as an.

In the invention, the driving region of the first electrode on the OEL panel and the second electrode are, for example, the stripe pattern. Also and, the extending direction of the first electrode is, for example, perpendicular to the extending direction of the second electrode.

In the invention, the patterned organic light emitting layer has multiple openings. The openings expose the contact regions, so as to allow the first electrode to be connected out. In addition, the patterned organic light emitting layer includes, for example, stripe pattern, so as to the contact region and be helpful for the first electrode to be connected out.

In the invention, the protection layer includes, for example, at least one inorganic waterproof layer, and preferably includes an organic waterproof layer with an inorganic waterproof layer. The organic waterproof layer has the thickness of, for example, 1000 nm to 6000 nm, and the inorganic waterproof layer has the thickness of, for example, 100 nm to 600 nm. Wherein, the material for the organic waterproof layer includes, for example, parylene, F-included resin or other polymer. The material for the inorganic waterproof layer includes, for example, silicon nitride, silicon oxide, silicon oxynitride, aluminum nitride, and so on.

In the invention, the OEL panel includes, for example, a single-layer panel with a first electrode, an organic light emitting layer, and a electrode.

In the invention, the OEL panel includes, for example, a multi-layer panel with a first electrode, a hole injection layer, a hole transporting layer, an organic light emitting layer, an electron transporting layer, an electron injection layer and a second electrode.

In the invention, the substrate includes a transparent substrate, such as the glass substrate, the plastic substrate, or flexible substrate. The plastic substrate and the flexible substrate can include polycarbonate (PC) substrate, polyester (PET) substrate, cyclic olefin copolymer (COC) substrate, metallocene-based cyclic olefin copolymer (mCOC) substrate or thin glass. The first electrode includes, for example, indium tin oxide (ITO), indium zinc oxide (IZO), or aluminum zinc oxide (AZO). The second electrode includes, for example, metal. The poly solder interconnection includes a material with low reflowing temperature, such as silver paste gold paste, chrome paste, or nickel paste. The printed circuit board includes, for example, a ceramic printed circuit board, and the bumps include, for example, gold stud bump.

BRIEF DESCRIPTION OF DRAWINGS

The invention can be more fully understood by reading the following detailed description of the preferred embodiments, with reference made to the accompanying drawings.

DETAILED DESCRIPTION

Figure 3:
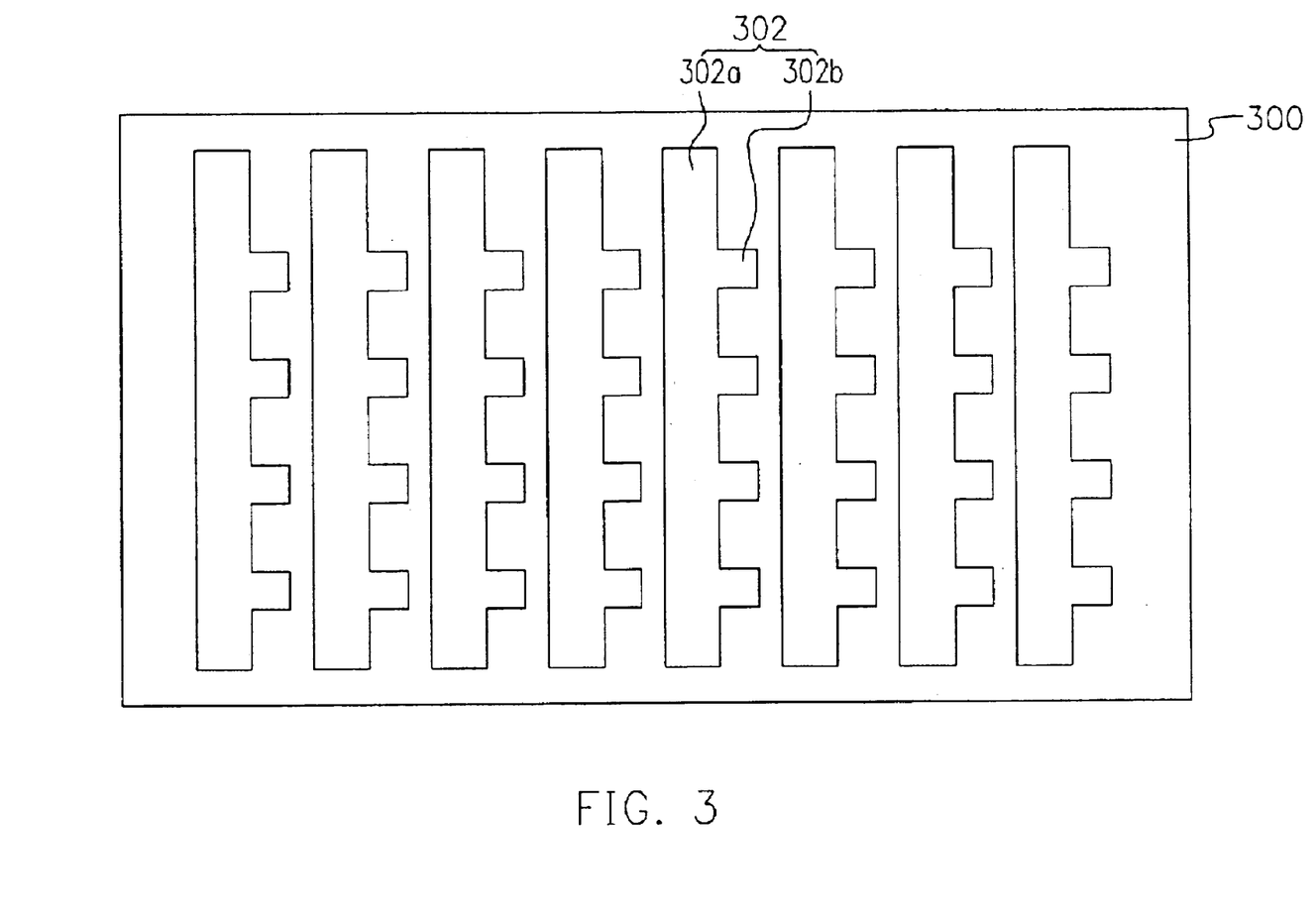
FIGS. 3–6 are drawings, schematically illustrating the process to fabricate an OEL panel, according to a first embodiment of the present invention.

Embodiment 1: FIGS. 3–6, are drawings, schematically illustrating the process to fabricate an OEL panel, according to a first embodiment of the present invention. In FIG. 3, a transparent substrate 300 is provided. Th transparent substrate 300 includes, for example, glass, acrylate, or other transparent materials. The transparent substrate 300 is formed with several anodes 302. The anode 302 includes a driving region 302a and at least one contact region 302b. The anode 302 includes the material, such as indium tin oxide (ITO) or other transparent conductive material. Wherein, the driving region 302a has, for example, a stripe pattern and parallel to each other, on the transparent substrate 300. The contact region 302b is protruding out from the driving region 302a, and is used for external connection to the other region.

Figure 4:
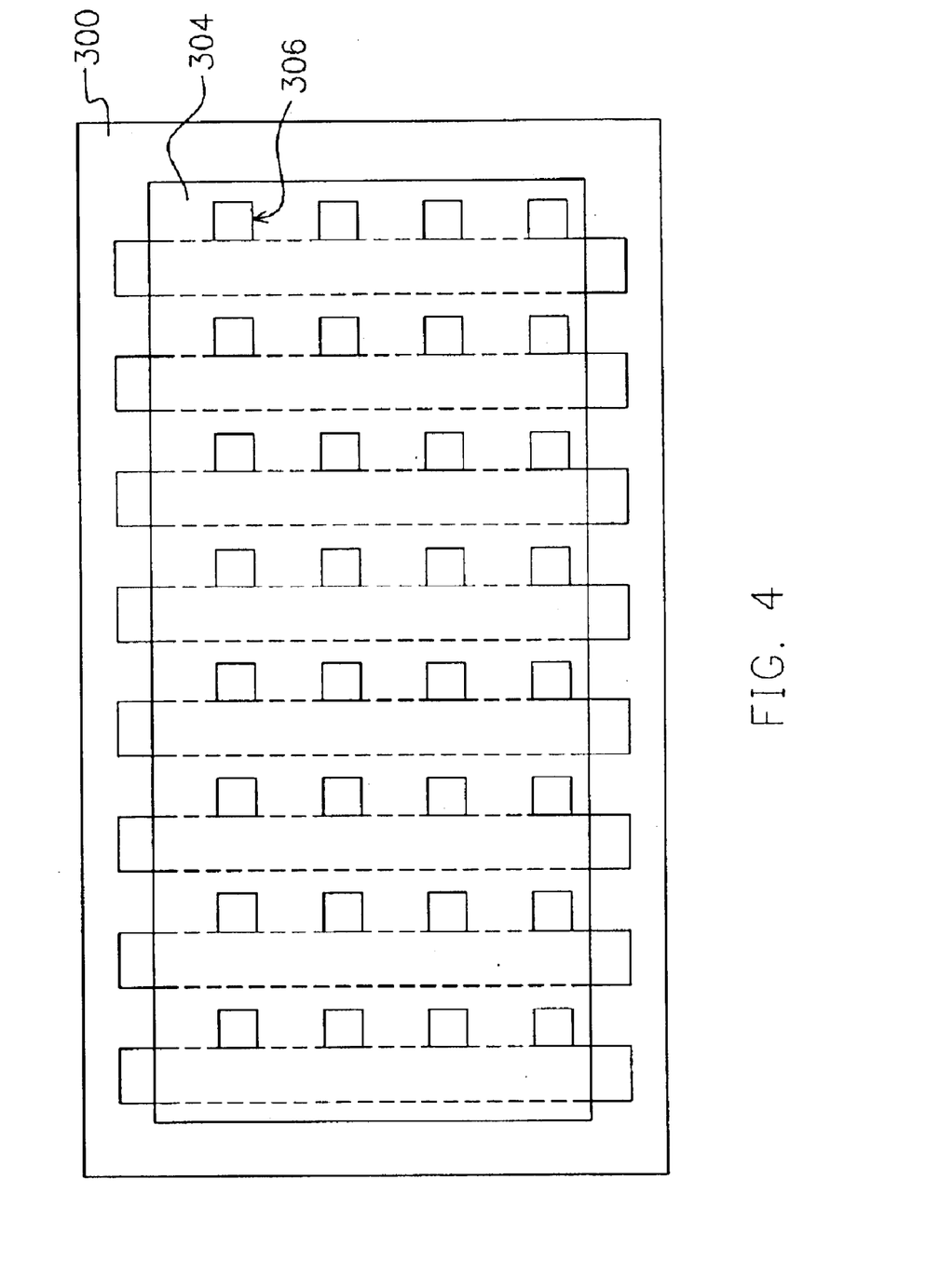

Referring to FIG. 4, after the anodes 302 have been formed, a patterned organic light emitting layer 304 is formed on the transparent substrate 300. The patterned organic light emitting layer 304 includes, for example, several openings 306. The positions of the opening 306 are, for example, corresponding to the positions of the contact regions 302b. Wherein, the patterned organic light emitting layer 304, for example, covers over the driving regions 302a of the anodes 302, but the contact regions 302b of the anodes 302 are exposed by the openings 306.

Figure 5:
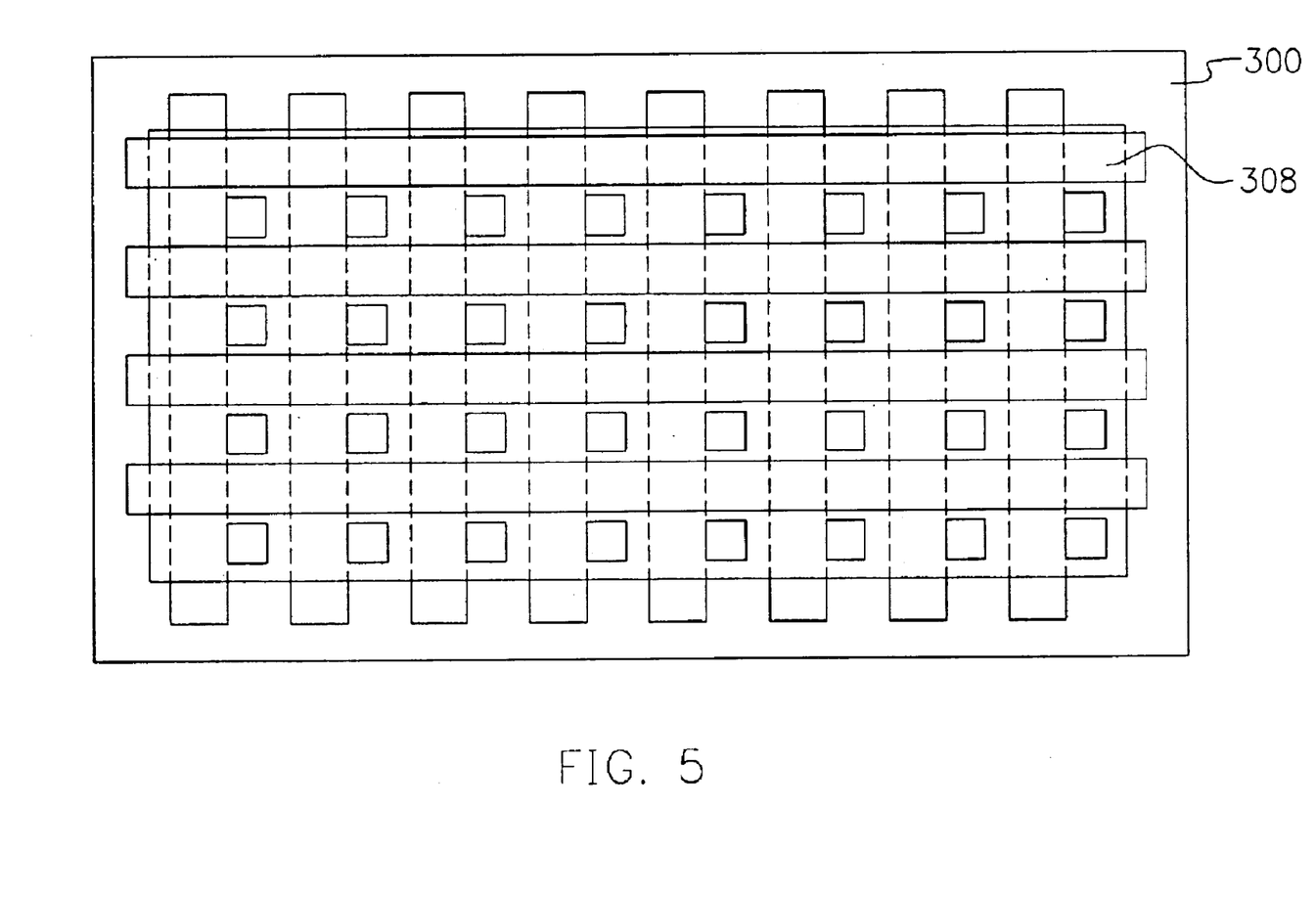

Referring to FIG. 5, after the patterned organic light emitting layer 304 has been formed, several cathodes 308 are formed. The cathodes 308, for example, are in a strip pattern and parallel to each other, on the patterned organic light emitting layer 304. Wherein, the cathode 308 includes, for example, metallic material. Also and, an extending direction of the cathodes 308 is, for example, perpendicular to the extending direction of the driving region 302a of the anode 302. In addition, the distribution position of the cathode 308, in principle, does not cover the contact regions 302b, which have been exposed by the openings 306.

Figure 6:
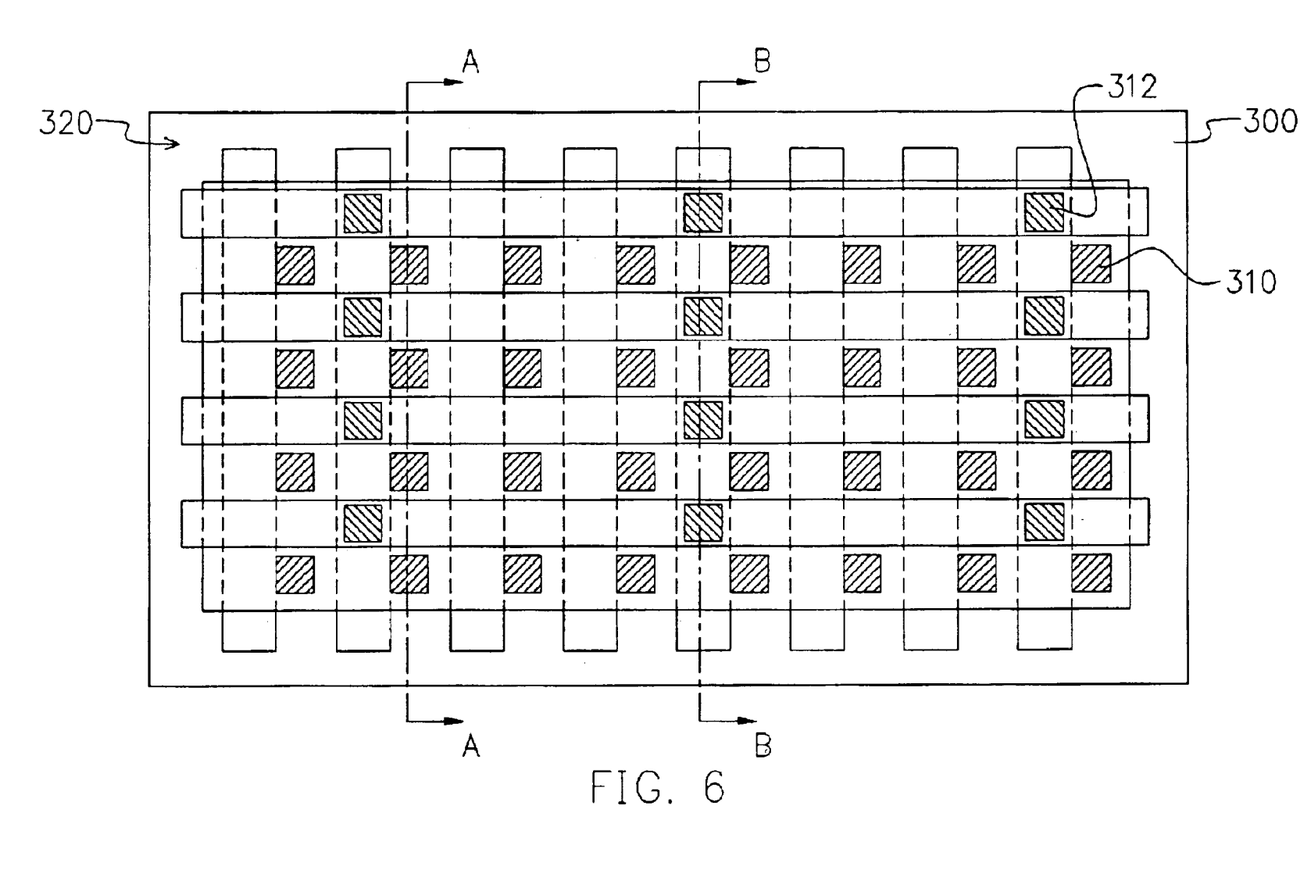

Referring to FIG. 6, after the cathodes 308 have been formed, a protection layer 320 is formed over. The protection layer 320 includes several openings 322 (see FIG. 7B) at the positions, for example, corresponding to the positions of the contact regions 302b. Wherein, the protection layer 320 includes, for example, an organic waterproof layer 320a and an inorganic waterproof layer 320b. The organic waterproof layer 320a has the thickness of, for example, 1000 nm to 6000 nm, and the inorganic waterproof layer 320b has the thickness of, for example, 100 nm to 600 nm. Wherein, the material for the organic waterproof layer 320a includes, for example, parylene, F-included resin or other polymer. The material for the inorganic waterproof layer 320b includes, for example, silicon nitride, silicon oxide, silicon oxynitride, aluminum nitride, and so on.

The poly solder interconnections 310 are respectively formed on the contact regions 302b, which have been exposed by the openings 322. Also and, the cathode 308 is formed with at least one poly solder interconnection 312 at the proper position. Wherein, the material of the poly solder interconnections 310 and 312, such as the silver paste, has the lower reflowing temperature, in which the reflowing temperature for the silver paste is about less than 100° C. The poly solder interconnections 310 are electrically coupled to the contact regions 302b, and the poly solder interconnections 312 are electrically coupled to the cathodes 308. It can be clear seen in figures that the anode 302 can be electrically coupled out through the poly solder interconnections 310, which are electrically coupled with the contact regions 302b. The cathodes 308 can be electrically coupled out through the poly solder interconnections 312. In addition, the poly solder interconnections 310 and the poly solder interconnections 312 on the panel are arranged in an array structure.

Figure 7A:
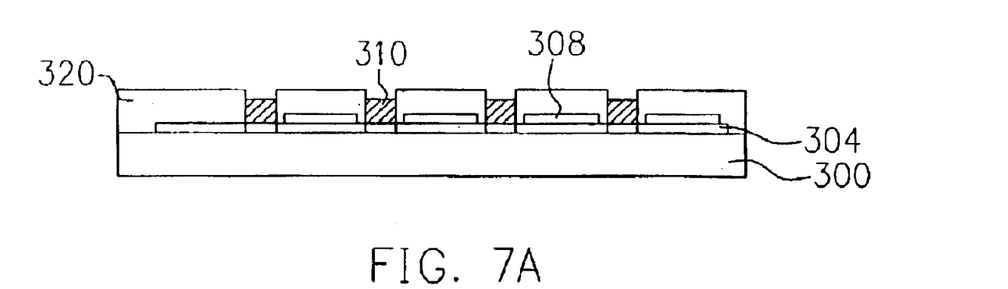
FIGS. 7A–7B are cross-sectional views, schematically illustrating the structure of the OEL panel, according to the first embodiment of the present invention.
Figure 7B:
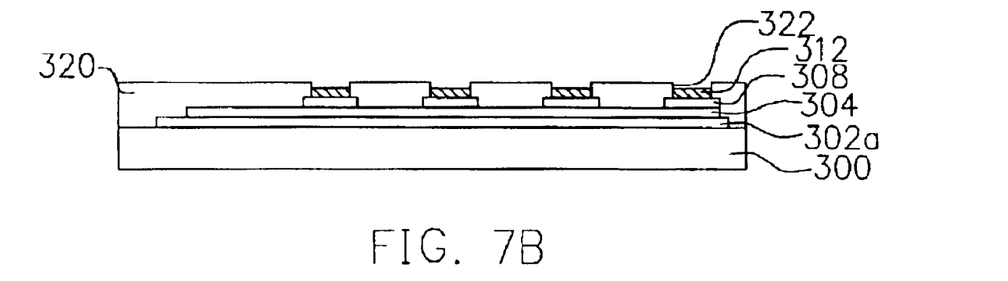

FIGS. 7A–7B are cross-sectional views, schematically illustrating the structure of the OEL panel, according to the first embodiment of the present invention. FIG. 7A is the cross-sectional view along the line A—A in FIG. 6, and FIG. 7B is the cross-sectional view along the line B—B in FIG. 6. In FIG. 7A, it can be clearly seen that the contact regions 302b of the anode 302 is electrically coupled out through the poly solder interconnection 310. In FIG. 7B, it can be clearly seen that the cathode 308 is electrically coupled out through the poly solder interconnection 312.

Figure 8A:
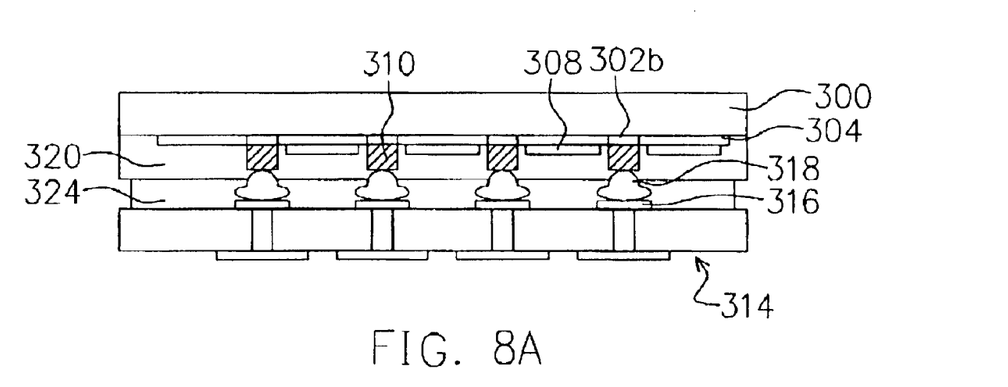
FIGS. 8A–8B are another cross-sectional views, schematically illustrating the structure of the OEL panel, according to the first embodiment of the present invention.
Figure 8B:
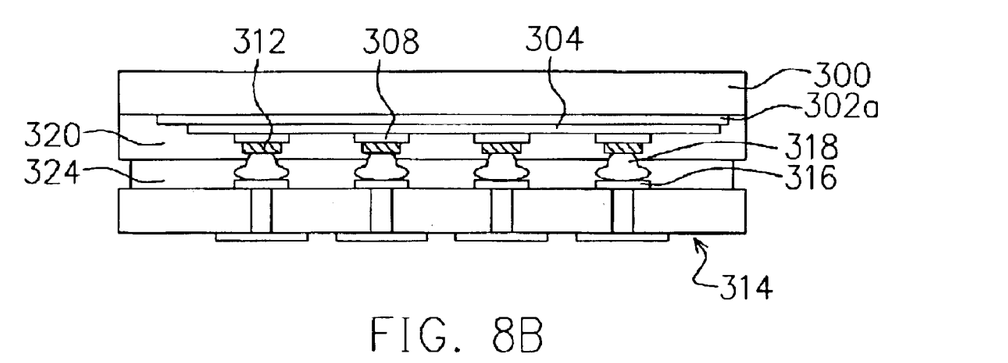
Figure 9:
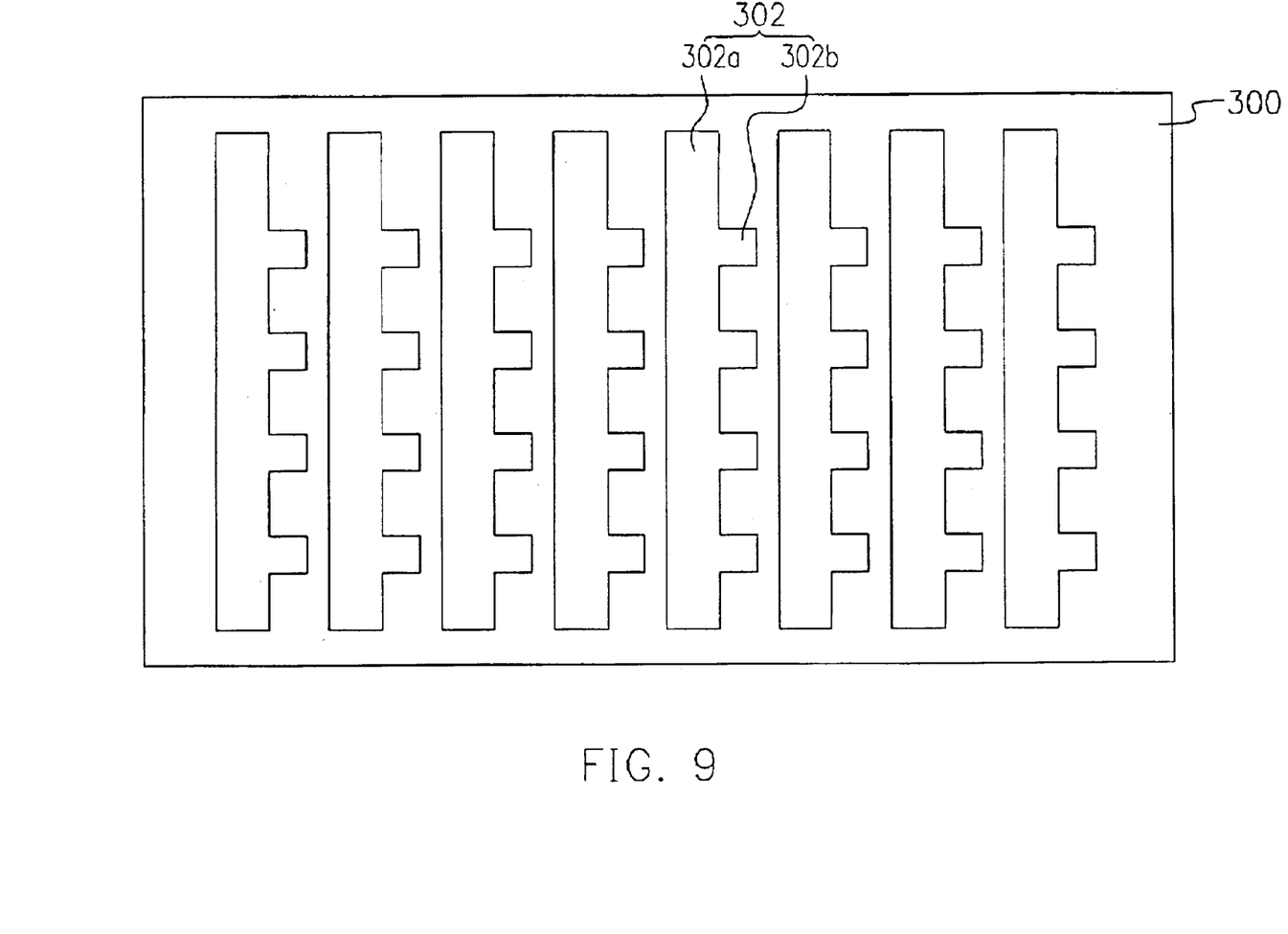
FIGS. 9–12 are drawings, schematically illustrating the process to fabricate an OEL panel, according to a second embodiment of the present invention.

FIGS. 8A–8B are another cross-sectional views, schematically illustrating the structure of the OEL panel, according to the first embodiment of the present invention. The package of the OEL panel mainly includes a printed circuit board 314, one or multiple OEL panels, several bumps 318, and underfill 324. Wherein, the OEL panel has several poly solder interconnections 310, 312 thereon, which are exposed by the openings 322 in the protection layer 320 and are arranged in an array structure. The printed circuit board 314 has several solder pads 316 and the corresponding trace. The bump 318 and the underfill 324 are, for example, disposed between the solder pads 316 and the poly solder interconnections 310, 312. The underfill 324 includes the hydrophobic material, which has the ability of preventing the water from diffusing in and the stress buffer at the same time. In the embodiment, several OEL panel can be assembled on the same printed circuit board 314, so as to further breakthrough the restriction of huge size.

In the embodiment, the packaging process for the OEL panel first provides a printed circuit board 314. The bumps 318 are formed on the solder pads 316 of the printed circuit board 314. The formation of the bumps 318 includes, for example, using a method like the wire bonding to form the bumps 318 on the solder pads 316, so as to form a structure like a stud bump. The bumps 318 include, for example, gold bump. However, the persons skilled in the art should know that the bump 318 in the embodiment is not limited to the gold stud bump. It can be other structure and different materials. After the bumps 318 have been formed, the underfill 324 is formed on the printed circuit board 314. The underfill 324 can be formed by, for example, screen printing or dispensing.

Then, at least one OEL panel, having the poly solder interconnections 310, 312, is flipped over, so that the poly solder interconnections 310, 312 are facing to the printed circuit board 314 and are aligned to bumps 318 on the solder pads 316. After reflowing or baking, the poly solder interconnections 310, 312 are electrically coupled with the bump 318. The curing process is also performed on the underfill 324 to cure it by, for example, heating or illuminating with ultra-violate ray. Since the poly solder interconnections 310, 312 have low reflowing temperature, the joint between the OEL panel and the printed circuit board 314 can be achieved at a temperature less than about 100° C. This is quite suitable for use in fabrication the OEL panel at the low temperature.

Furthermore, the foregoing printed circuit board 314 is, for example, a ceramic printed circuit board with good thermal dissipation. Since the ceramic printed circuit board is used, this is helpful for the OEL module to have the mechanism of good thermal dissipation.

Embodiment 2: FIGS. 9–12 are drawings, schematically illustrating the process to fabricate an OEL panel, according to a second embodiment of the present invention. First, referring to FIG. 9, a transparent substrate 300 is provided. The transparent substrate 300 includes, for example, glass, acrylate, or other transparent materials. The transparent substrate 300 is formed with several anodes 302. The anode 302 includes a driving region 302a and at least one contact region 302b. The anode 302 includes the material, such as indium tin oxide (ITO) or other transparent conductive material. Wherein, the driving region 302a has, for example, a stripe pattern and parallel to each other, on the transparent substrate 300. The contact region 302b is protruding out from the driving region 302a, and is used for external connection to the other region.

Figure 10:
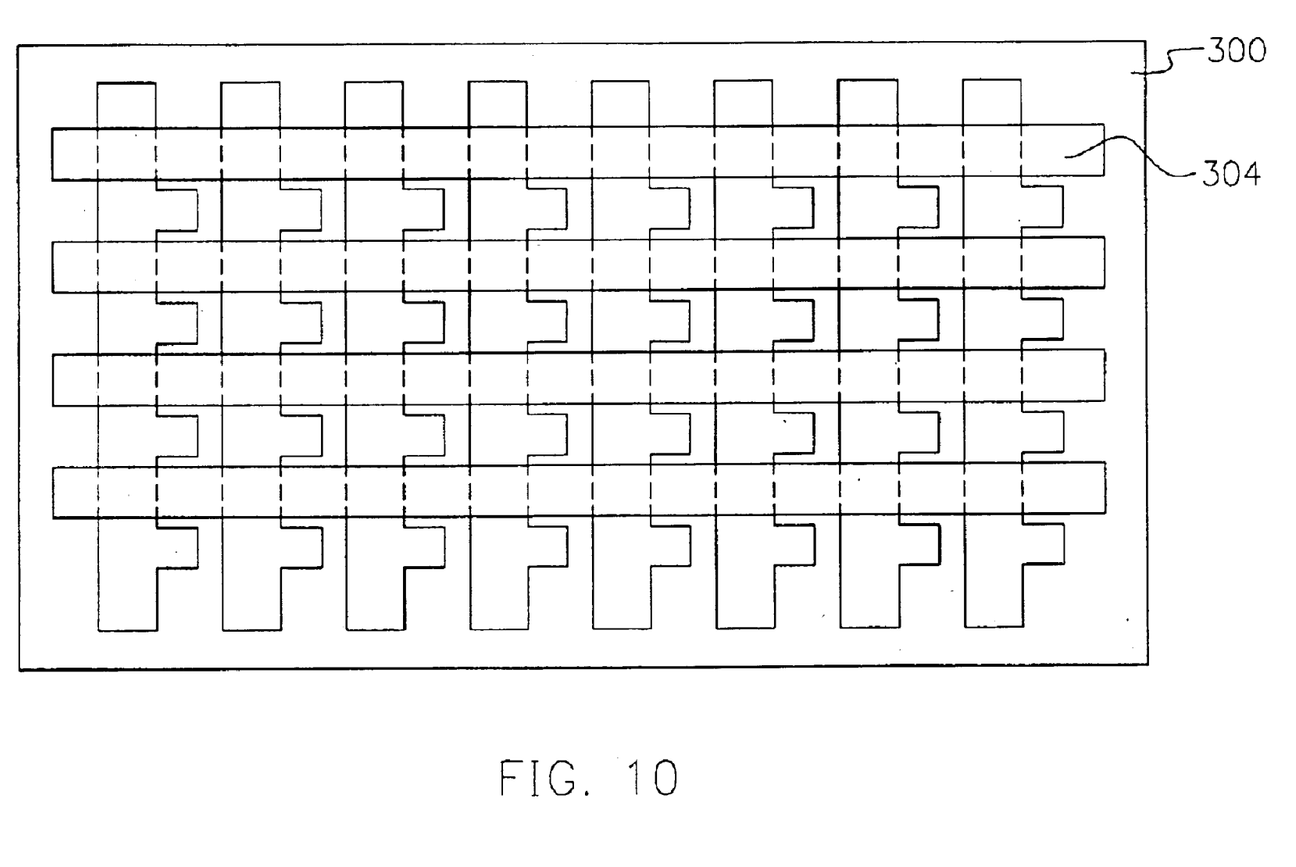

Referring to FIG. 10, after the anodes 302 have been formed, a patterned organic light emitting layer 304 is formed on the transparent substrate 300. The patterned organic light emitting layer 304 includes, for example, several stripe patterns. The distribution position of the patterned organic light emitting layer 304 is in principle not covering the contact regions 302b of the anodes 302, so as to expose the contact regions 302b of the anodes 302.

Figure 11:
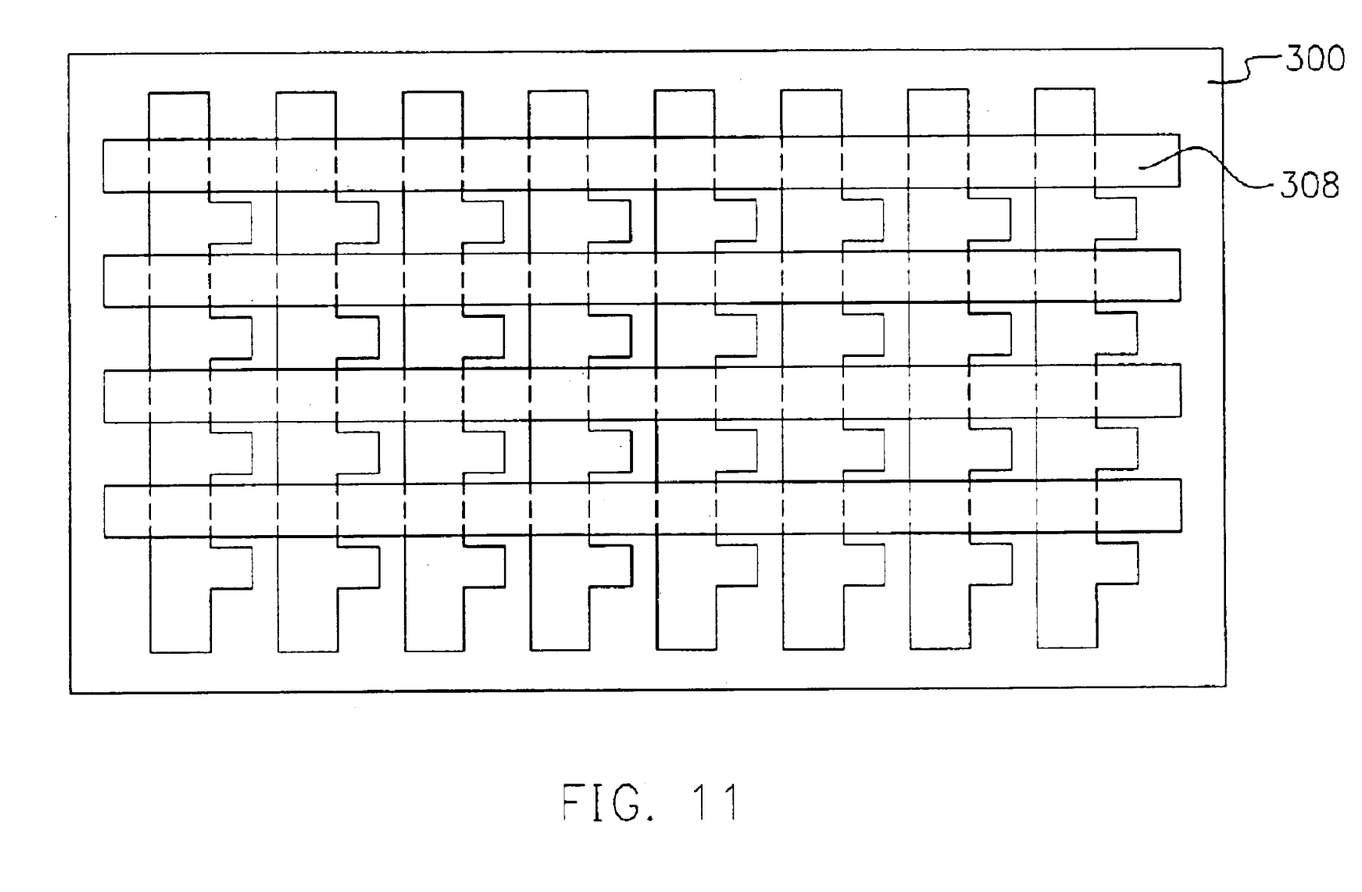

Referring to FIG. 11, after the patterned organic light emitting layer 304 is formed, then several cathodes 308 are formed on the patterned organic light emitting layer 304. The cathode 308 includes, for example, the pattern like the patterned organic light emitting layer 304. Wherein, the extending direction of the cathodes 308 is, for example, perpendicular to the extending direction of the driving region 302a of the anode 302.

Figure 12:
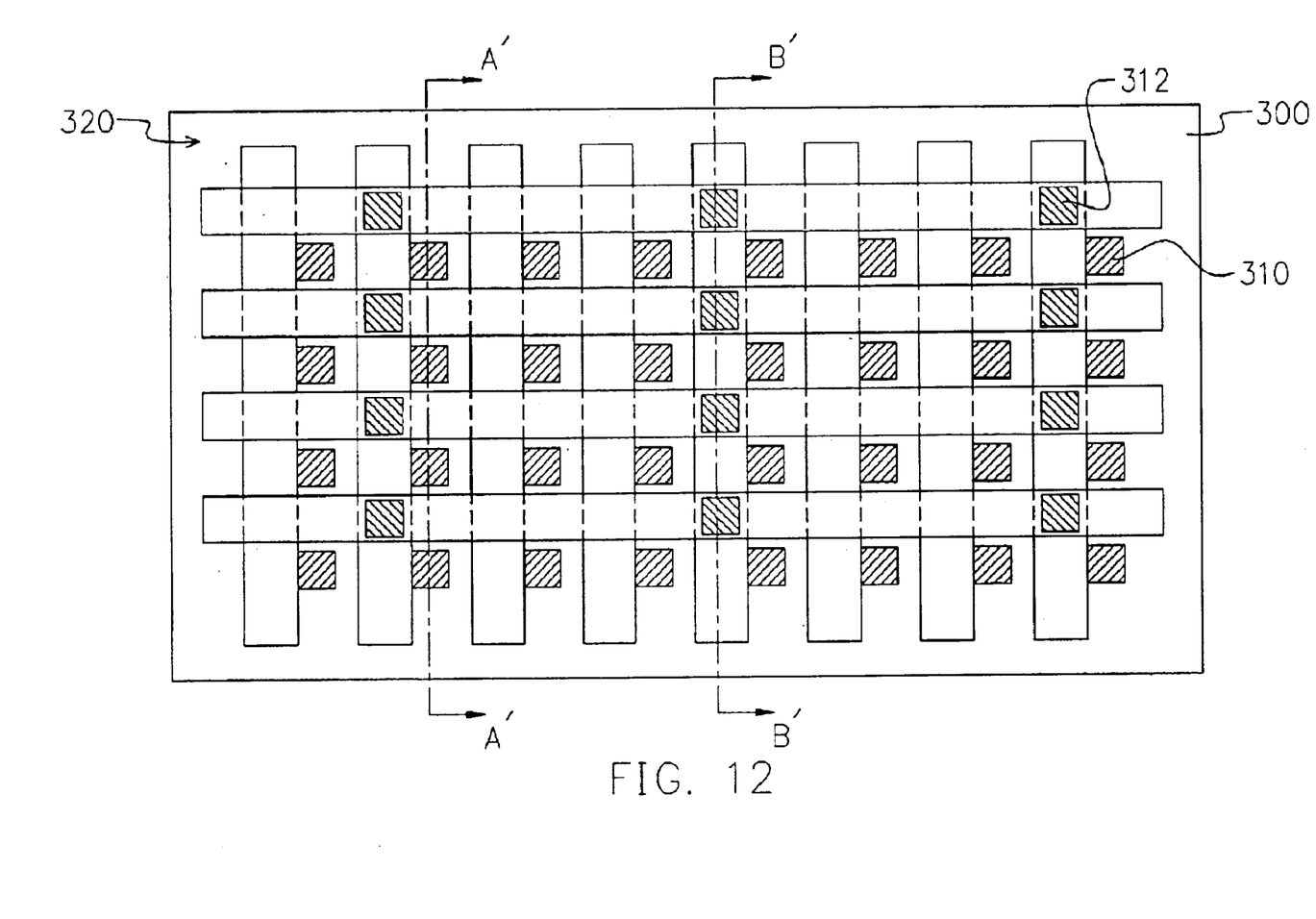

Referring to FIG. 12, after the cathode 308 has been formed, then a protection layer 320 is formed over. The protection layer 320 includes several openings 322 at the positions (see FIG. 13A), for example, corresponding to the positions of the contact regions 302b. Wherein, the protection layer 320 includes, for example, an organic waterproof layer 320a and an inorganic waterproof layer 320b. The organic waterproof layer 320a has the thickness of, for example, 1000 nm to 6000 nm, and the inorganic waterproof layer 320b has the thickness of, for example, 100 nm to 600 nm. Wherein, the material for the organic waterproof layer 320a includes, for example, parylene, F-included resin or other polymer. The material for the inorganic waterproof layer 320b includes, for example, silicon nitride, silicon oxide, silicon oxynitride, aluminum nitride, and so on.

The poly solder interconnection 310 is formed on the contact region 302b, and at least one poly solder interconnection 312 is formed on the cathode 308 at the proper position. Wherein, the poly solder interconnections 310 and 312 includes, for example, silver paste. The poly solder interconnection 310 is electrically coupled with the contact region 302b, and the poly solder interconnection 312 is electrically coupled with the cathode 308. It is clear as shown in figures that the anode 302 can be coupled out through the poly solder interconnection 310, which is electrically coupled with the contact region 302b. The cathode 308 can be coupled out through the poly solder interconnection 312. In addition, the poly solder interconnections 310 and 312 on the panel are, for example, arranged into an array structure.

Figure 13A:
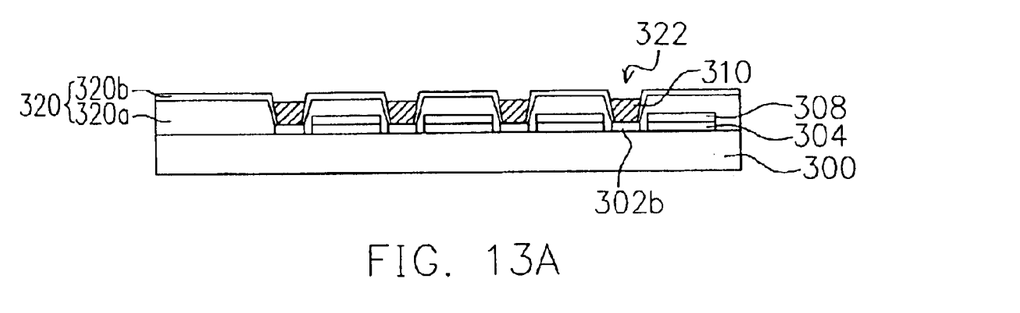
FIGS. 13A–13B are cross-sectional views, schematically illustrating the structure of the OEL panel, according to the second embodiment of the present invention.
Figure 13B:
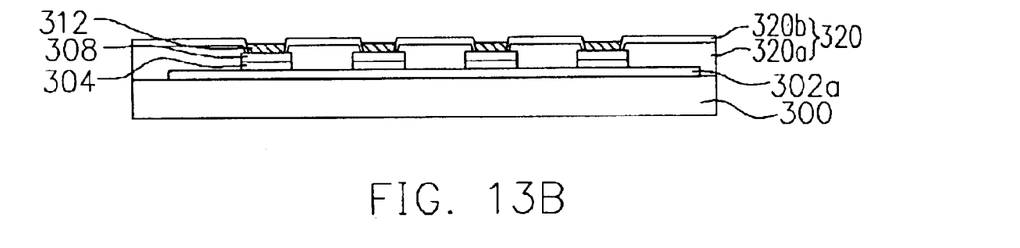

Referring to FIGS. 13A–13B, they are cross-sectional views, schematically illustrating the structure of the OEL panel, according to the second embodiment of the present invention. FIG. 13A is the cross-sectional view along the line A"—A" in FIG. 12, and FIG. 13B is the cross-sectional view along the line B"—B" in FIG. 12. In FIG. 13A, it can be clearly seen that the contact regions 302b of the anode 302 is electrically coupled out through the poly solder interconnection 310. In FIG. 13B, it can be clearly seen that the cathode 308 is electrically coupled out through the poly solder interconnection 312.

Figure 14A:
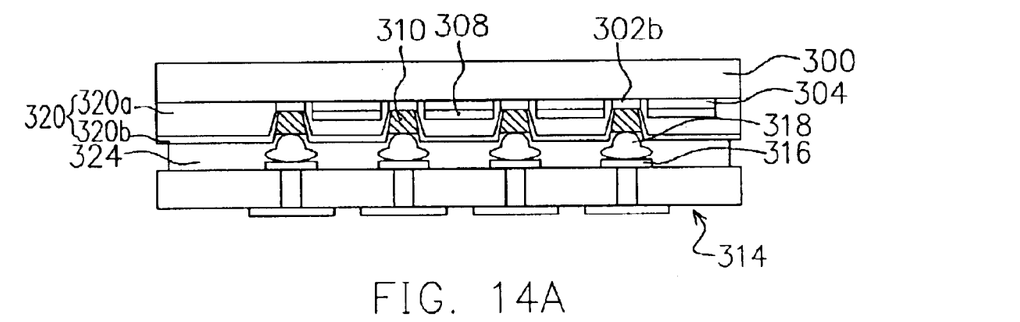
FIGS. 14A–14B are cross-sectional views, schematically illustrating the structure of the OEL panel, according to the second embodiment of the present invention.
Figure 14B:
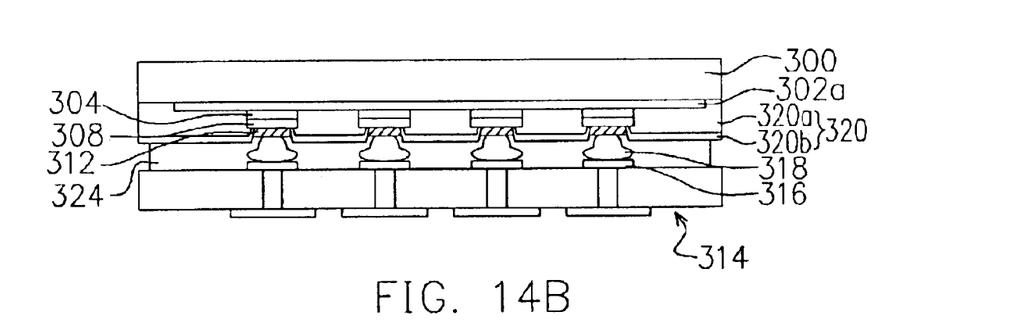

FIGS. 14A–14B are another cross-sectional views, schematically illustrating the structure of the OEL panel, according to the second embodiment of the present invention. The package structure of the panel is similar to the structure as shown in FIGS. 8A and 8B. The difference is the design of the organic light emitting layer 304 in the OEL panel. In FIG. 8A and FIG. 8B, the opening 306 in the organic light emitting layer 304 exposes the contact region 302b. However, in this embodiment, the organic light emitting layer 304 has the stripe pattern, which exposes the contact region 302b.

Figure 15A:
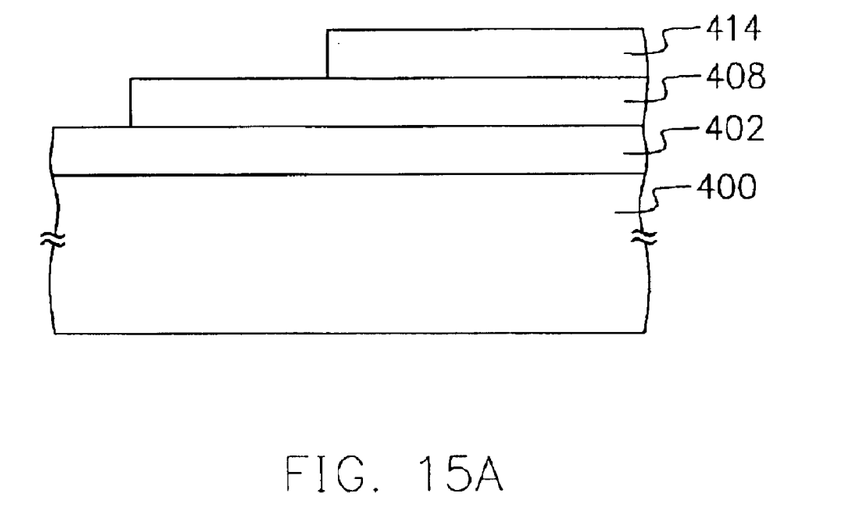
FIGS. 15A–15D are cross-sectional views, schematically illustrating the structure of the OEL panel, according to the first and the second embodiment of the present invention.
Figure 15B:
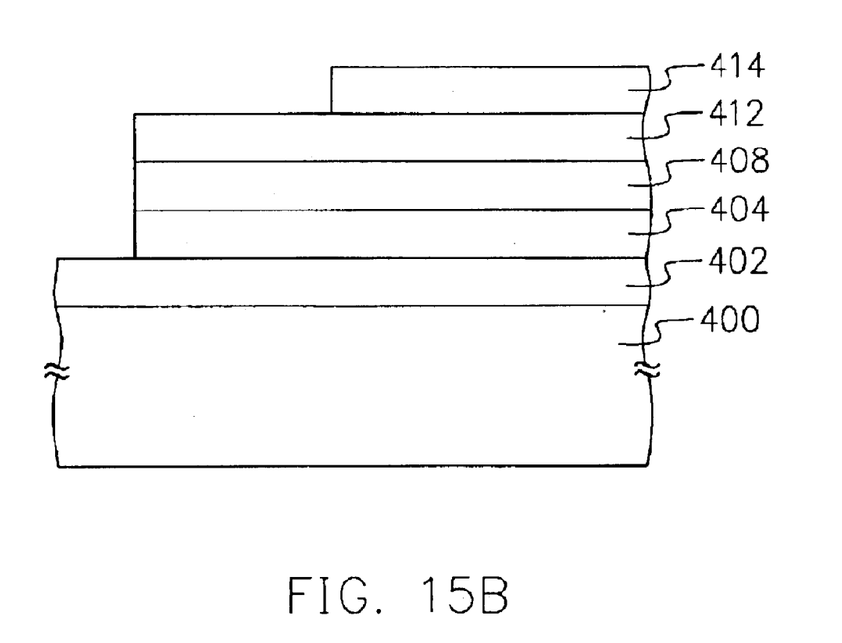
Figure 15C:
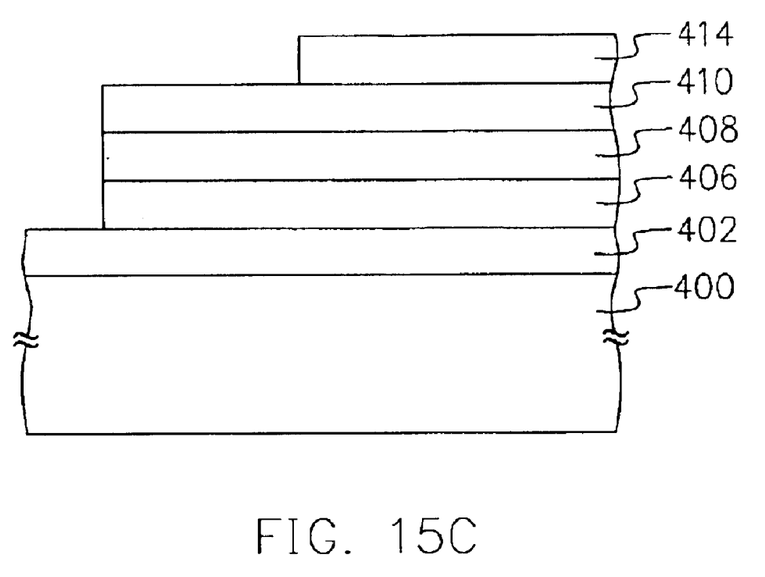
Figure 15D:
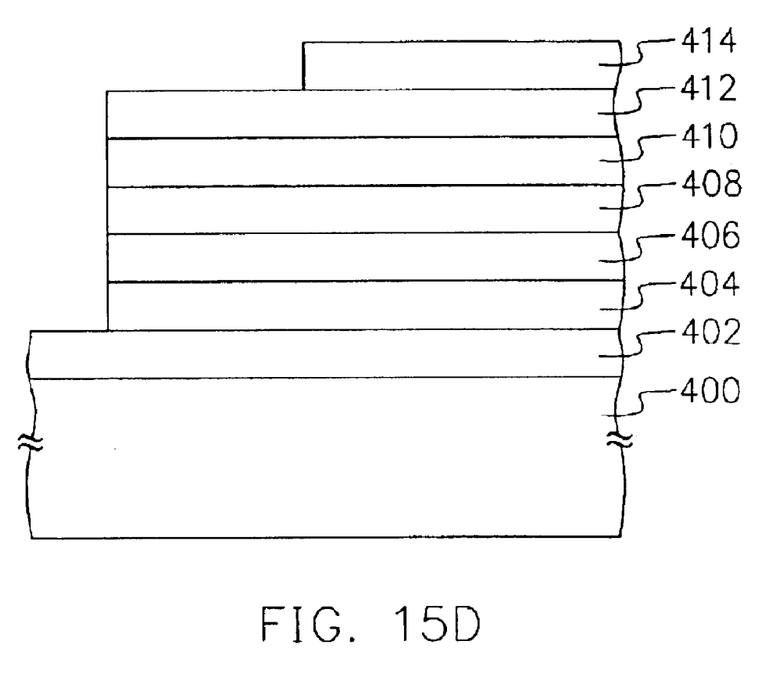

Referring to FIG. 15A and FIG. 15D, they are cross-sectional views, schematically illustrating the structure of the OEL panel, according to the first and the second embodiment of the present invention. In the embodiment 1 and embodiment 2, even though the single-layer structure, of which only one layer of the organic light emitting layer 304 is disposed between the anode 302 and the cathode 308, is taken as the example of OEL panel for descriptions, the persons skilled in the art should easily know that the OEL panel of the invention can also be a multi-layer structure.

In FIG. 15A, the OEL panel is implemented on a transparent substrate 400. The transparent substrate 400 is implemented with an anode 402, an organic light emitting layer 408, and a cathode 414, as a single-layer structure, of which one layer is disposed between the anode 402 and the cathode 414. In FIG. 15B, the OEL panel includes an anode 402, a hole injection layer 404, an organic light emitting layer 408, an electron injection layer 412, and a cathode 414, as the three-layer structure. In FIG. 15C, the OEL panel includes an anode 402, a hole transporting layer 406, an organic light emitting layer 408, an electron transporting layer 410, and a cathode 414, as the three-layer structure. In FIG. 15D, the OEL panel includes an anode 402, a hole injection layer 404, a hole transporting layer 406, an organic light emitting layer 408, an electron transporting layer 410, an electron injection layer 412, and a cathode 414, as the five-layer structure.

In summary, the invention is directed to package structure and the fabrication process for the OEL panel with several advantages as follows: 1. In the package of the OEL panel in the invention, multiple panels can be integrated on a printed circuit board, so that it is more practical and useful for the OEL panel in consideration of huge display sale. 2. In the package of the OEL panel in the invention, since the reflowing temperature for the poly solder interconnection is relative low, so that the joint for the OEL panel and the printed circuit board can be achieved at a temperature less than 100° C. This is satisfying the requirement at low temperature for the fabrication process. 3. In the package of the OEL panel in the invention, the ceramic printed circuit board has been used, so that it is helpful for the thermal dissipation mechanism in the OEL module. 4. In the package of the OEL panel in the invention, the connection between the bump and the poly solder interconnection can reduce a lot of the circuit path. This is quite helpful for the OEL panel to be reduced in thickness and weight. 5. In the package of the OEL panel in the invention, the underfill has the hydrophobic material, which has the ability of preventing the water from diffusing in and the stress buffer at the same time. 6. In the package of the OEL panel in the invention, the protection layer significantly improves the reliability of the package.

What is claimed is:

1. A package structure of organic electroluminescence (OEL) panel, comprising:

a printed circuit board, having a plurality of solder pads;

at least one OEL panel, disposed over the printed circuit board, wherein the OEL panel comprises:

a substrate;

a plurality of first electrodes, disposed on the substrate, wherein each of the first electrodes includes a driving region and at least one contact region, and the contact region is protruding out from the driving region;

at least one patterned organic light emitting layer, disposed over the substrate, wherein the patterned organic light emitting layer exposes the contact region;

a plurality of second electrodes, disposed on the patterned organic light emitting layer;

a protection layer, disposed over the substrate and including a plurality of first openings, wherein the first openings exposes the contact regions and a portion of the second electrodes;

a plurality of poly solder interconnections, disposed on the contact regions and the second electrodes; and a plurality of bumps, respectively disposed between the solder pads and the poly solder interconnections, so as to have electric connection between the OEL panel and the printed circuit board.

2. The package structure of claim 1, wherein the driving region for each of the first electrodes is a stripe pattern.

3. The package structure of claim 1, wherein each of the second electrodes is a stripe pattern.

4. The package structure of claim 1, wherein an extending direction of the first electrodes is perpendicular to an extending direction of the second electrodes.

5. The package structure of claim 1, wherein the poly solder interconnections includes silver paste.

6. The package structure of claim 1, wherein the printed circuit board includes a ceramic printed circuit board.

7. The package structure of claim 1, wherein the bumps includes gold bumps.

8. The package structure of claim 1, wherein the patterned organic light emitting layer includes a plurality of second openings, and the second openings expose the contact regions.

9. The package structure of claim 1, wherein patterned organic light emitting layer includes a plurality of stripe patterns, whereby the contact regions are exposed.

10. The package structure of claim 1, wherein the protection layer includes at least one inorganic waterproof layer.

11. The package structure of claim 1, wherein the protection layer comprises:
an organic waterproof layer; and
an inorganic waterproof layer, disposed outer from the organic waterproof layer.

12. The package structure of claim 11, wherein the organic waterproof layer comprises parylene, F-containing resin, or polymer.

13. The package structure of claim 11, wherein the inorganic waterproof layer comprises at least one selected from the group consisting of silicon nitride, silicon oxide, silicon oxynitride, and aluminum nitride.

14. The package structure of claim 1, further comprising an underfill paste, disposed between the printed circuit board and the OEL panel.

15. The package structure of claim 1, wherein the poly solder interconnections include a material with a relative low reflowing temperature.

16. The package structure of claim 1, wherein poly solder interconnections are arranged into an array structure.

17. A package structure of an organic electroluminescence (OEL) panel, comprising:
a substrate;
a plurality of first electrodes, disposed on the substrate, wherein each of the first electrodes includes a driving region and at least one contact region, and the contact region is protruding out from the driving region;
at least one patterned organic light emitting layer, disposed over the substrate, wherein the patterned organic light emitting layer exposes the contact region;
a plurality of second electrodes, disposed on the patterned organic light emitting layer;
a protection layer, disposed over the substrate and including a plurality of first openings, wherein the first openings exposes the contact regions and a portion of the second electrodes; and
a plurality of poly solder interconnections, disposed on the exposed contact regions and the second electrodes.

18. The package structure of claim 17, wherein the driving region for each of the first electrodes is a stripe pattern.

19. The package structure of claim 17, wherein each of the second electrodes is a stripe pattern.

20. The package structure of claim 17, wherein an extending direction of the first electrodes is perpendicular to an extending direction of the second electrodes.

21. The package structure of claim 17, wherein the poly solder interconnections includes silver paste.

22. The package structure of claim 17, wherein the patterned organic light emitting layer includes a plurality of second openings, and the second openings expose the contact regions.

23. The package structure of claim 17, wherein patterned organic light emitting layer includes a plurality of stripe patterns, whereby the contact regions are exposed.

24. The package structure of claim 17, wherein the poly solder interconnections are arranged into an array structure.

25. The package structure of claim 17, wherein the protection layer includes at least one inorganic waterproof layer.

26. The package structure of claim 17, wherein the protection layer comprises:
an organic waterproof layer; and
an inorganic waterproof layer, disposed outer from the organic waterproof layer.

27. The package structure of claim 26, wherein the organic waterproof layer comprises parylene, F-containing resin, or polymer.

28. The package structure of claim 26, wherein the inorganic waterproof layer comprises at least one selected from the group consisting of silicon nitride, silicon oxide, silicon oxynitride, and aluminum nitride.

29. The package structure of claim 17, wherein the poly solder interconnections include a material with a relative low reflowing temperature.

* * * * *